United States Patent
Liu

(10) Patent No.: US 12,543,595 B2
(45) Date of Patent: Feb. 3, 2026

(54) LIGHT-EMITTING ASSEMBLY, DISPLAY DEVICE, AND METHOD FOR MAKING LIGHT-EMITTING ASSEMBLY

(71) Applicant: Century Technology (Shenzhen) Corporation Limited, Shenzhen (CN)

(72) Inventor: Kuang-Hua Liu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 853 days.

(21) Appl. No.: 17/741,003

(22) Filed: May 10, 2022

(65) Prior Publication Data

US 2023/0290758 A1    Sep. 14, 2023

(30) Foreign Application Priority Data

Mar. 11, 2022   (CN) .......................... 202210238564.3

(51) Int. Cl.
*H01L 25/075* (2006.01)
*H01L 23/00* (2006.01)
(Continued)

(52) U.S. Cl.
CPC .......... *H01L 25/0753* (2013.01); *H01L 24/19* (2013.01); *H01L 24/20* (2013.01); *H01L 24/24* (2013.01); *H10H 20/857* (2025.01); *H01L 2224/19* (2013.01); *H01L 2224/2105* (2013.01); *H01L 2224/215* (2013.01);
(Continued)

(58) Field of Classification Search
CPC .................................................. H01L 25/0753
See application file for complete search history.

(56) References Cited

U.S. PATENT DOCUMENTS 9,978,728 B2 *   5/2018   Lin ...................... H01L 25/0753
12,015,103 B2 *  6/2024   Lo .......................... C30B 25/183
(Continued)

FOREIGN PATENT DOCUMENTS

| CN | 103078026 A | 5/2013 | |
| CN | 108198933 A | 6/2018 | |
| TW | 1741129 B * | 10/2021 | ............. G06F 3/041 |

OTHER PUBLICATIONS

English machine translation of TW-1741129-B (Year: 2021).*

*Primary Examiner* — Yara B Green
*Assistant Examiner* — Erika H Son
(74) *Attorney, Agent, or Firm* — ScienBiziP, P.C.

(57) ABSTRACT

A light-emitting assembly with higher connection tolerances in manufacture includes a substrate, a light-emitting diode on the substrate, a transparent electrode, and a wire connected to the transparent electrode. The substrate includes a driving circuit connected to the light-emitting diode. The light-emitting diode includes a first electrode, a second electrode, and a light-emitting layer between the first electrode and the second electrode, the first electrode receiving the first driving signal. transparent electrode is connected to the second electrode. An orthographic projection area of the transparent electrode on the substrate is larger than an orthographic projection area of the second electrode on the substrate allowing less criticality in the alignment of signal wires for receiving the second driving signal. The light-emitting diode is configured to emit source light according to the first driving signal and the second driving signal.

18 Claims, 9 Drawing Sheets

(51) Int. Cl.
  *H10H 20/01*   (2025.01)
  *H10H 20/857*  (2025.01)
(52) U.S. Cl.
  CPC .. *H01L 2224/221* (2013.01); *H01L 2224/224* (2013.01); *H01L 2224/24226* (2013.01); *H01L 2224/244* (2013.01); *H10H 20/0364* (2025.01)

(56) References Cited

U.S. PATENT DOCUMENTS

2021/0296536 A1* 9/2021 Wang .................. H01L 25/13
2024/0243109 A1* 7/2024 Watanabe ............ H10H 20/857
2024/0355788 A1* 10/2024 Park .................... H10H 20/82

\* cited by examiner

LIGHT-EMITTING ASSEMBLY, DISPLAY DEVICE, AND METHOD FOR MAKING LIGHT-EMITTING ASSEMBLY

FIELD

The present disclosure generally relates to lighting and display technology, particularly relates to a light-emitting assembly, a display device, and a method for making the light-emitting assembly.

BACKGROUND

A light-emitting diode (LED) is widely used in lighting devices, display devices, and the like. A vertical type of LED has an upper electrode, a lower electrode, and a light-emitting layer between the upper electrode and the lower electrode. When a voltage difference between the upper electrode and the lower electrode reaches a preset value, the light-emitting layer will emit light of a certain wavelength. A size of a single LED is very small (micron scale), so one lighting device or one display device always includes a plurality of closely arranged LEDs to achieve light-emitting or display. The upper electrode and/or the lower electrode of each LED needs to be electrically connected to other conductive structures by connecting wires. However, it is difficult to align the connecting wires with the upper electrode and/or the lower electrode of the LED because of the small size of a single LED, which causes misalignment, wherein a current loop cannot be formed, and the LED cannot emit light normally.

DETAILED DESCRIPTION

Figure 1:
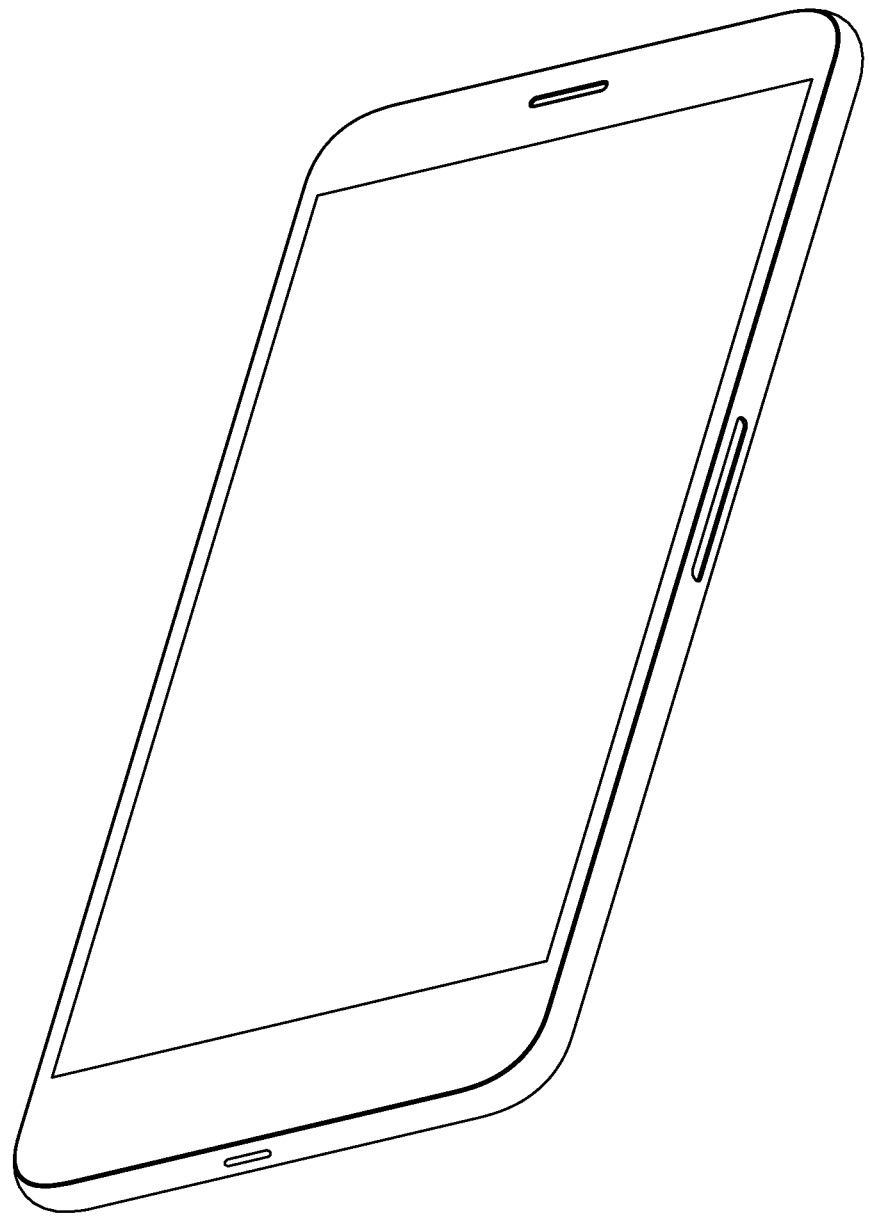
FIG. 1 shows a display device in a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "comprising," when utilized, means "including, but not necessarily limited to"; it specifically indicates open-ended inclusion or membership in the so-described combination, group, series, and the like.

"Above" means one layer is located on top of another layer. In one example, it means one layer is situated directly on top of another layer. In another example, it means one layer is situated over the second layer with more layers or spacers in between.

When a feature or element is herein referred to as being "on" another feature or element, it can be directly on the other feature or element or intervening features and/or elements may also be present. It will also be understood that, when a feature or element is referred to as being "connected", "attached" or "coupled" to another feature or element, it can be directly connected, attached or coupled to the other feature or element or intervening features or elements may be present.

As shown in FIG. 1, a display device 100 is used to display images. The display device 100 is, for example, a smart device such as a mobile phone, a computer, a TV, or an outdoor display screen. In this embodiment, the display device 100 is a self-illuminating display device including a light-emitting assembly 10 shown in FIG. 2. The display device 100 may further include one or more optical function films (such as a brightness enhancement film, an antireflection film, etc., neither shown), an outer frame (not shown), or other structures.

Figure 2:
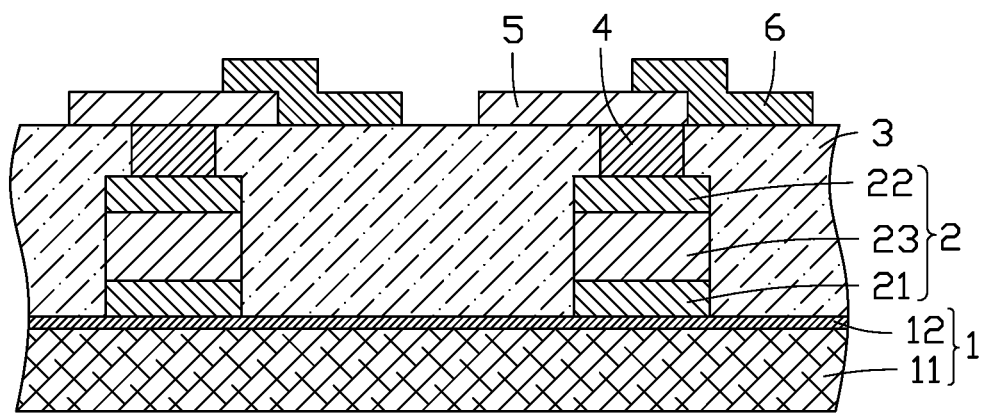
FIG. 2 is a cross-sectional view of a light-emitting assembly of the display device in FIG. 1.

As shown in FIG. 2, the light-emitting assembly 10 includes a substrate 1 and a plurality of light-emitting diodes (LEDs) 2 on a surface of the substrate 1.

In this embodiment, the substrate 1 includes a glass plate 11 and a driving circuit 12 on a surface of the glass plate 11. In this embodiment, the driving circuit 12 includes metal (such as copper) traces on the surface of the glass plate 11. The glass plate 11 is used for carrying and supporting, and the driving circuit 12 is used to provide electrical signals for the light-emitting assembly 10 to work. In this embodiment, the driving circuit 12 is used to output a first driving signal.

Figure 3:
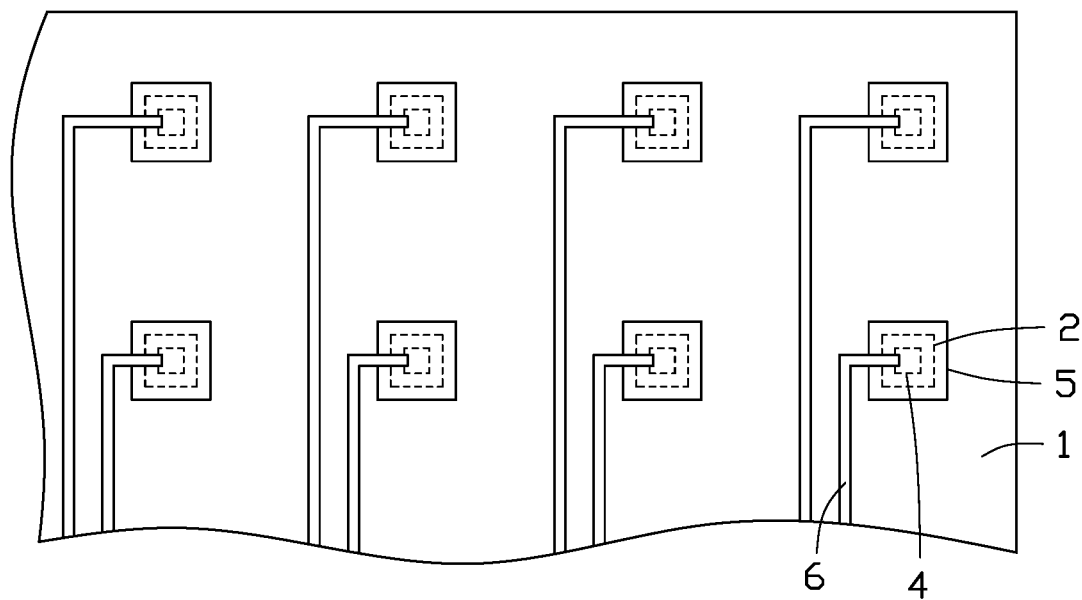
FIG. 3 is a planar view of the light-emitting assembly in FIG. 2.

As shown in FIG. 3, in this embodiment, the LEDs 2 on the substrate 1 are spaced apart from each other, and the LEDs 2 are arranged in an array including a plurality of rows and a plurality of columns. The light-emitting diodes 2 emit source light, respectively. In this embodiment, the display device 100 defines a plurality of pixel areas arranged in an array including a plurality of rows and a plurality of columns. Each pixel area is provided with three adjacent light-emitting diodes 2, and the three adjacent light-emitting diodes 2 in the same pixel area are configured to emit red, green, and blue source light, respectively. Light from the pixel areas displays an image. In this embodiment, each light-emitting diode 2 can be a miniature inorganic LED, a micro inorganic LED, an organic LED, or the like.

As shown in FIG. 2, in this embodiment, each light-emitting diode 2 is a vertical light-emitting diode. That is, each light-emitting diode 2 includes a first electrode 21, a second electrode 22, and a light-emitting layer 23 between the first electrode 21 and the second electrode 22. That is, the first electrode 21, the light-emitting layer 23, and the second electrode 22 are stacked in turn. In this embodiment, the first electrode 21 is closer than the second electrode 22 to the substrate 1.

The first electrode 21 and the second electrode 22 include conductive materials for transmitting electrical signals. The light-emitting layer 23 includes light-emitting material. When the first electrode 21 and the second electrode 22 receive electrical signals and a preset voltage difference is formed between two sides of the light-emitting layer 23, the light-emitting material is stimulated to emit light, so that the light-emitting layer 23 emits light. That is, the light-emitting diode 2 emits source light. In this embodiment, each light-emitting diode 2 emits the source light in a direction mainly away from the substrate 1.

The light-emitting assembly 10 further includes an insulating layer 3. The insulating layer 3 is on the surface of the substrate 1 having the light-emitting diodes 2 and covers all the light-emitting diodes 2. That is, each light-emitting diode 2 is embedded in the insulating layer 3. In this embodiment, the insulating layer 3 is made of insulating and at least translucent material.

The light-emitting assembly 10 further includes a plurality of connection pads 4 electrically connected to the light-emitting diodes 2 in a one-to-one manner. In this embodiment, each connection pad 4 is on a side of the second electrode 22 away from the substrate 1 and is electrically connected to the second electrode 22. In this embodiment, each connection pad 4 is embedded in the insulating layer 3, and a surface of each connection pad 4 away from the substrate 1 is exposed from the insulating layer 3.

The light-emitting assembly 10 further includes a plurality of transparent electrodes 5 electrically connected to the light-emitting diodes 2 in a one-to-one manner. In this embodiment, each transparent electrode 5 is on the side of one second electrode 22 away from the substrate 1. In this embodiment, each transparent electrode 5 is on a side of one connection pad 4 away from the substrate 1 and at least partially covers the surface of the connection pad 4 exposed from the insulating layer 3. That is, in this embodiment, each connection pad 4 is electrically connected between one second electrode 22 and one transparent electrode 5, and each transparent electrode 5 is on a surface of the insulating layer 3 away from the substrate 1.

The light-emitting assembly 10 further includes a plurality of wires 6 connected to the light-emitting diodes 2 in a one-to-one manner. Each wire 6 is electrically connected to one light-emitting diode 2 through one transparent electrode 5. In this embodiment, each wire 6 is on the surface of the insulating layer 3 away from the substrate 1.

In this embodiment, the transparent electrodes 5 are made of transparent conductive material, and the connection pads 4 and the wires 6 are made of metal (such as copper).

In a manufacture process of the light-emitting assembly 10 of this embodiment, a substrate 1 is provided, and the light-emitting diodes 2, the connection pads 4, the transparent electrodes 5, and the wires 6 are sequentially formed on the substrate 1. The wires 6 need to be precisely connected with the transparent electrodes 5 to ensure that a complete current loop is formed in the light-emitting assembly 10.

In a comparative embodiment, the transparent electrodes 5 are not included in a light-emitting assembly, and each wire is directly in electrical contact with a connection pad on a light-emitting diode. It is difficult to precisely align the wire and the connection pad because of the small sizes of the light-emitting diode and the connection pad, which may cause alignment deviation and not form a current loop correctly.

In this embodiment, an orthographic projection area of each transparent electrode 5 on the substrate 1 is larger than an orthographic projection area of each of the connection pads 4 on the substrate 1. That is, in a direction parallel to the substrate 1, an area of each transparent electrode 5 is larger than an area of each connection pad 4. Since each transparent electrode 5 has a larger area than each connection pad 4, alignment of the wires 6 with each transparent electrode 5 is easier than aligning the wires 6 with each connection pad 4. The wires 6 and the transparent electrodes 5 can be in electrical contact even if the wires 6 deviate from the center of the transparent electrodes 5.

In this embodiment, the orthographic projection of each transparent electrode 5 on the substrate 1 completely covers the orthographic projection of the connection pad 4 on the substrate 1, so that a facing area of the transparent electrode 5 and the connection pad 4 is maximized, and a contact area of the transparent electrode 5 and the connection pad 4 is maximized, which is conducive to improving a reliability of electrical connection.

In another embodiment of this embodiment, the connection pads 4 are not included, and the transparent electrodes 5 are in direct electrical contact with the second electrodes 22. In another embodiment, the orthographic projection area of each transparent electrode 5 on the substrate 1 is larger than the orthographic projection area of each second electrode 22 on the substrate 1. That is, in a direction parallel to the substrate 1, an area of each transparent electrode 5 is larger than an area of each second electrode 22 to which it is electrically connected. Since each transparent electrode 5 has a larger area than each second electrode 2, it is easier to align the wires 6 with each transparent electrode 5 than aligning the wires 6 with each second electrode 2. The wires 6 and the transparent electrodes 5 can be in electrical contact even if the wires 6 deviate from the center of the transparent electrodes 5.

Furthermore, in this further embodiment, the orthographic projection of each transparent electrode 5 on the substrate 1 completely covers the orthographic projection of each second electrode 22 on the substrate 1, so that a facing area between the transparent electrode 5 and the second electrode 22 is maximized. Therefore, a contact area between the transparent electrode 5 and the second electrode 22 is maximized, which is beneficial to improve reliability of electrical connection.

In this embodiment, the driving circuit 12 is used to output the first driving signal, and each wire 6 is used to receive and transmit a second driving signal. The first electrode 21 is used to receive the first driving signal, and the second electrode 22 is used to receive the second driving signal. The first driving signal and the second driving signal cause a voltage difference between two sides of the light-emitting layer 23 so that the light-emitting diode 2 can emit light. When the voltage difference formed between the two sides of the light-emitting layer 23 changes, a light intensity of the source light changes with the voltage difference. By controlling values of the first driving signal and the second driving signal, the intensity of the source light emitted by each light-emitting diode 2 can be adjusted, so that the light-emitting diodes 2 cooperate to display an image.

In this embodiment, each wire 6 extends on the surface of the insulating layer 3 away from the substrate 1 and is finally connected to a circuit board or a driving chip (not shown).

Figure 4:
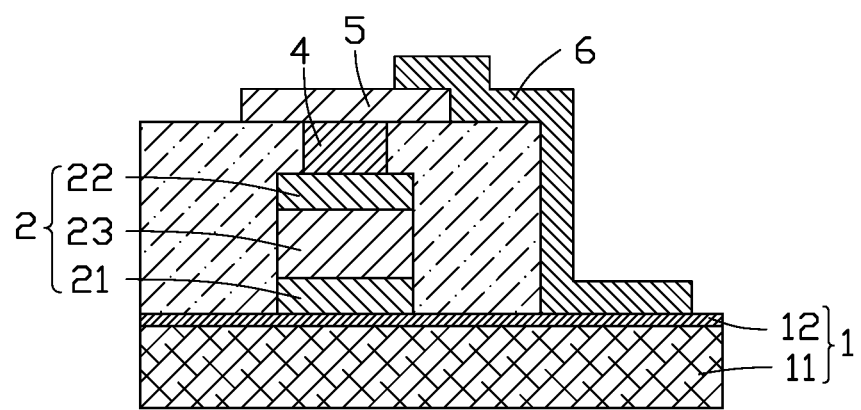
FIG. 4 is a cross-sectional view of a light-emitting assembly in another embodiment of the present disclosure.

In the modified embodiment of this embodiment, as shown in FIG. 4, a part of each wire 6 extends on the surface of the insulating layer 3 away from the substrate 1, and the other part of each wire 6 extends to the surface of the substrate 1 having the light-emitting diodes 2 and is electrically connected to the driving circuit 12. That is, in this further embodiment, the driving circuit 12 is further electrically connected to the wires 6 to output the second driving signal to each wire 6.

In another embodiment, the light-emitting assembly 10 may further include bonding material (such as solder paste, not shown) between each light-emitting diode 2 and the substrate 1. The bonding material is used to fix the light-emitting diodes 2 on the substrate 1.

In another embodiment, the light-emitting assembly 10 may be used as a lighting device or a stage lighting device in addition to use as a display device, wherein the light-emitting diodes 2 are used to emit source light of the same color (such as white).

The light-emitting assembly 10 of this embodiment includes the light-emitting diodes 2 and the transparent electrodes 5 electrically connected to the light-emitting diodes 2. Each light-emitting diode 2 includes a second electrode 22. The orthographic projection area of each transparent electrode 5 on the substrate 1 is larger than that of each second electrode 22 on the substrate, which increases the size and therefore tolerance of alignment area between the transparent electrodes 5 and the wires 6, thereby improving a manufacturing yield of the light-emitting assembly 10.

Figure 5:
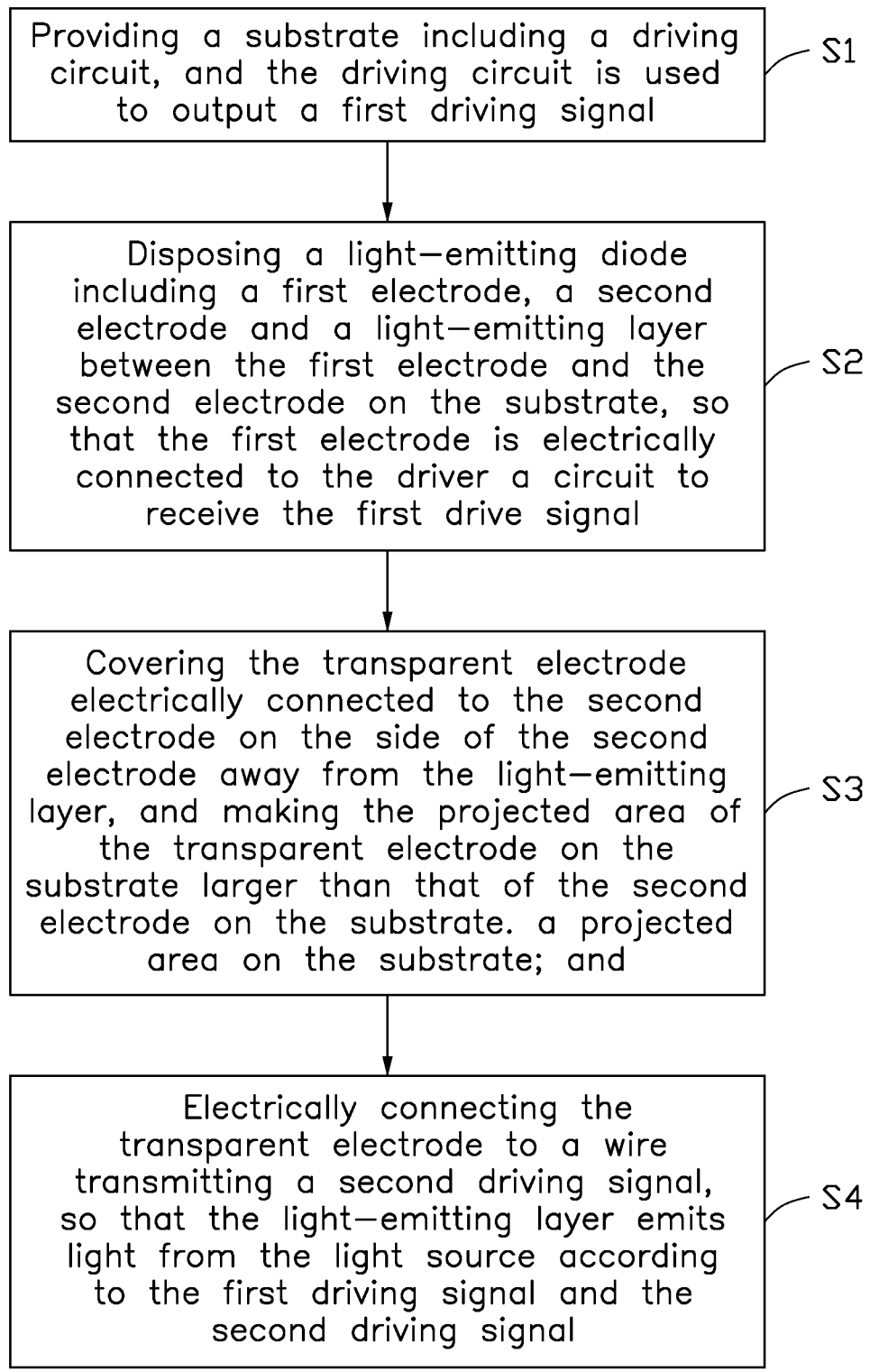
FIG. 5 is a flow chart of a method for making the light-emitting assembly in a first embodiment of the present disclosure.

As shown in FIG. 5, a flowchart is presented in accordance with an example embodiment which is being thus illustrated. The example method for making light-emitting assembly is provided by way of example, as there are a variety of ways to carry out the method. The method for making light-emitting assembly described below can be carried out using the configurations illustrated in FIGS. 2, 3, and 4, for example, and various elements of these figures are referenced in explaining example method for making light-emitting assembly. Each block shown in FIG. 5 represents one or more processes, methods, or subroutines, carried out in the method for making light-emitting assembly. Additionally, the illustrated order of blocks is by example only and the order of the blocks can change according to the present disclosure. The exemplary method for making light-emitting assembly can begin at block S1. The method for making light-emitting assembly includes:

block S1, providing a substrate including a driving circuit, and the driving circuit being used to output a first driving signal;

block S2, forming a light-emitting diode including a first electrode, a second electrode, and a light-emitting layer between the first electrode and the second electrode on the substrate, the first electrode being electrically connected to the driving circuit to receive the first drive signal;

block S3, forming a transparent electrode on a side of the second electrode away from the light-emitting layer, the transparent electrode covering and connected to the second electrode, and an orthographic projection area of the transparent electrode on the substrate being larger than that of the second electrode on the substrate; and block S4, connecting the transparent electrode to a wire transmitting a second driving signal, so that the light-emitting layer emits source light according to the first driving signal and the second driving signal.

Figure 6:
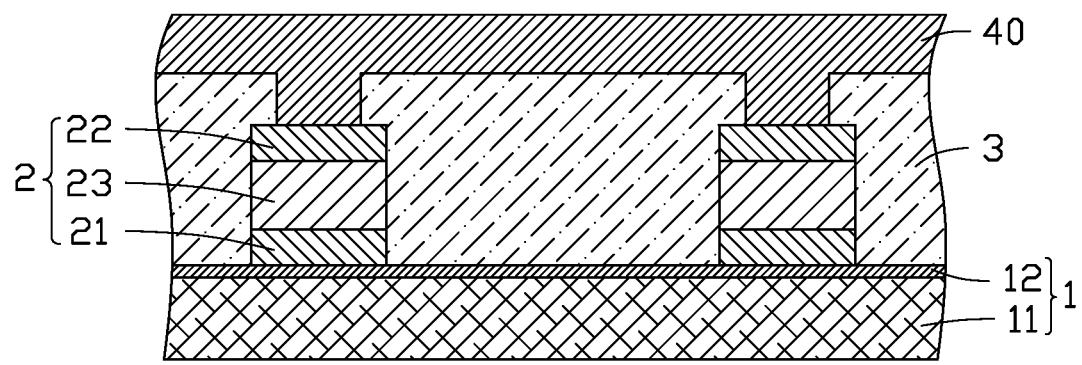
FIG. 6 is a cross-sectional view of the light-emitting assembly after block S2 process in the flow chart of FIG. 5.

As shown in FIG. 6, in block S2, a plurality of light-emitting diodes 2 are fixed to the surface of the substrate 1 having the driving circuit 12, and the insulating layer 3 covering the light-emitting diodes 2 is formed. Each light-emitting diode 2 includes a first electrode 21, a second electrode 22, and a light-emitting layer 23 between the first electrode 21 and the second electrode 22, wherein the first electrode 21 is closer than the second electrode 22 to the substrate 1, so that the first electrode 21 electrically connected to the driving circuit 12. The insulating layer 3 completely covers the light-emitting diodes 2.

In block S2, the insulating layer 3 is etched, such as by laser etching, corrosive liquid or etching gas etching, so that the second electrode 22 of each light-emitting diode 2 is exposed from the insulating layer 3.

In block S2, a metal layer 40 is formed on the side of the insulating layer 3 away from the substrate 1 by evaporation, printing, inkjet printing, or a physical vapor deposition (PVD) process.

Figure 7:
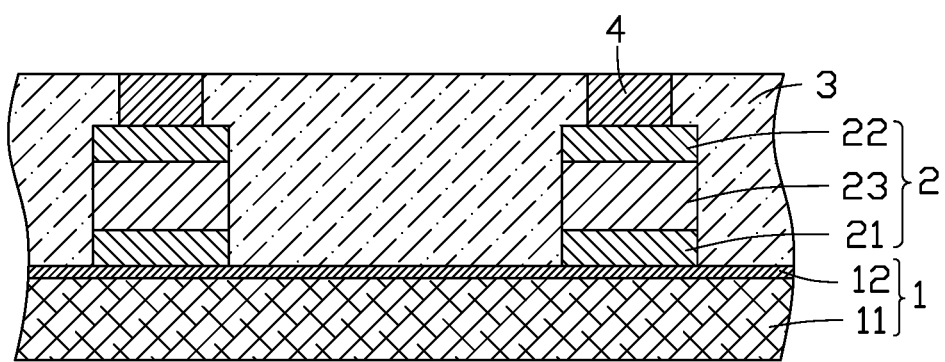
FIG. 7 is another cross-sectional view of the light-emitting assembly after block S2 in the flow chart of FIG. 5.

As shown in FIG. 7, in block S2, the metal layer 40 is patterned by chemical mechanical polishing, metal stripping process, yellow light, etc. to form the connection pads 4, and each connection pad 4 is connected to one first light-emitting diode 2. The second electrodes 22 are embedded in the insulating layer 3. In this embodiment, the surface of each connection pad 4 away from the substrate 1 is exposed from the insulation layer 3 and is flush with the surface of the insulating layer 3 away from the substrate 1.

Figure 8:
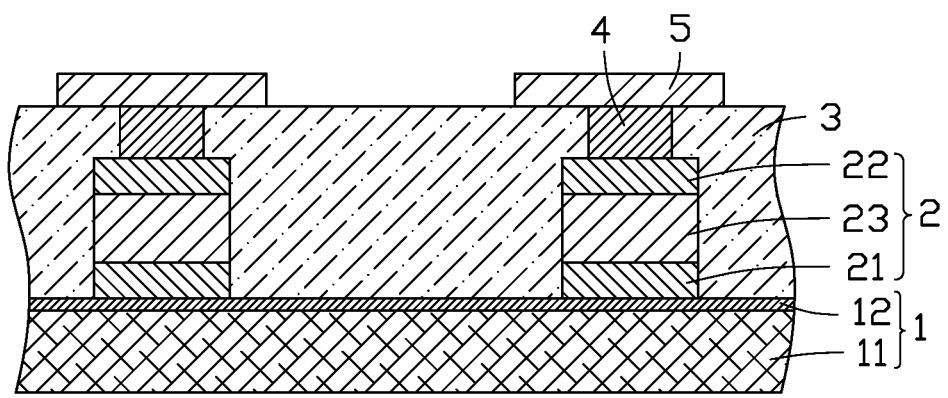
FIG. 8 is a cross-sectional view of the light-emitting assembly after block S3 process in the flow chart of FIG. 5.

As shown in FIG. 8, in block S3, transparent electrodes 5 are formed on the surface of the insulating layer 3 away from the substrate 1. Each transparent electrode 5 is electrically connected to one connection pad 4. In this embodiment, an orthographic projection area of each transparent electrode 5 on the substrate 1 is larger than an orthographic projection area of each second electrode 22 on the substrate 1, and also larger than an orthographic projection area of each connection pad 4 on the substrate 1. In this embodiment, the orthographic projection of each transparent electrode 5 on the substrate 1 completely covers the orthographic projection of each second electrode 22 on the substrate 1, and also completely covers the orthographic projection of each connection pad 4 on the substrate 1.

In block S4, wires 6 are formed on the surface of the insulating layer 3 away from the substrate 1, so that each wire 6 is electrically connected to one transparent electrode 5, to obtain the light-emitting assembly 10 shown in FIG. 2.

The method for making light-emitting assembly in this embodiment is beneficial for reducing the alignment difficulty of conductive structures (transparent electrodes and the second electrode) in the light-emitting assembly 10, thereby improving the manufacturing yield of the light-emitting assembly 10.

Second Embodiment

Figure 9:
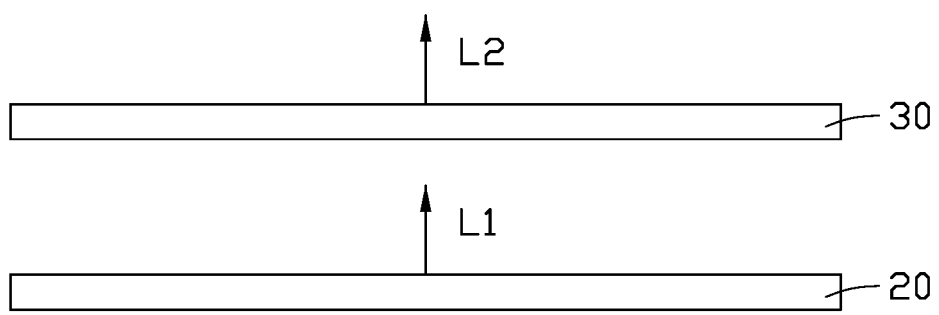
FIG. 9 illustrates a display device in a second embodiment of the present disclosure.

The display device 200 of this embodiment is shown in FIG. 9. A main difference between the display device 200 and the display device 100 of the first embodiment is that the display device 200 is not a self-illuminating display device.

As shown in FIG. 8, the display device 200 of this embodiment includes a light-emitting assembly 20 and a display assembly 30 stacked together. The light-emitting assembly 20 is used to provide the source light L1, the display assembly 30 is on the optical path of the source light L1 and is configured to modulate the source light L1 so that image light L2 displays an image. In this embodiment, the display assembly 30 is, for example, a liquid crystal display assembly, which includes structures such as a liquid crystal layer, a polarizer, and an array substrate.

In this embodiment, each light-emitting diode 2 of the light-emitting assembly 20 is used to emit light of the same color.

Other structures and manufacturing methods in the light-emitting assembly 20 in this embodiment are as described in the first embodiment.

The display device 200 and the light-emitting assembly 20 of this embodiment also take the beneficial effects described in the first embodiment.

The embodiments shown and described above are only examples. Many details are often found in the art such as the other features of a light-emitting assembly and a display device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A light-emitting assembly comprising:
a substrate comprising a driving circuit configured for outputting a first driving signal;
a plurality of light-emitting diodes on the substrate and connected to the driving circuit, each of plurality of light-emitting diodes comprising a first electrode, a second electrode, and a light-emitting layer between the first electrode and the second electrode, the first electrode being connected to the driving circuit to receive the first driving signal;
a plurality of transparent electrodes electrically insulated from each other, each of the plurality of light-emitting diodes being connected to a corresponding one of the plurality of transparent electrodes, and the plurality of transparent electrodes being connected to a side of the second electrode away from the light-emitting layer, an orthographic projection area of each of the plurality of transparent electrodes on the substrate being larger than an orthographic projection area of the second electrode on the substrate; and
a plurality of wires connected to the plurality of transparent electrodes and each of the plurality of wires being configured to transmit a second driving signal, wherein each of the plurality of light-emitting diodes is configured to emit source light according to the first driving signal and the second driving signal.

2. The light-emitting assembly of claim 1, wherein the orthographic projection of each of the plurality of transparent electrodes on the substrate completely covers the orthographic projection of each of the plurality of second electrodes on the substrate.

3. The light-emitting assembly of claim 1, further comprising a plurality of connection pads, each of the plurality of connection pads connected between the second electrode and one of the plurality of transparent electrodes; wherein
the orthographic projection area of each of the plurality of transparent electrodes on the substrate is larger than an orthographic projection area of each of the plurality of connection pads on the substrate.

4. The light-emitting assembly of claim 3, wherein the plurality of connection pads are made of metal.

5. The light-emitting assembly of claim 3, wherein the orthographic projection of each of the plurality of transparent electrodes on the substrate completely covers the orthographic projection of each of the plurality of connection pads on the substrate.

6. The light-emitting assembly of claim 1, wherein the plurality of wires electrically connects to the driving circuit, and the driving circuit is configured to output the second driving signal.

7. The light-emitting assembly of claim 1, further comprising an insulation layer covering a surface of the substrate having the plurality of light-emitting diodes; wherein
the plurality of light-emitting diodes are embedded in the insulation layer;
the plurality of transparent electrodes are on a side of the insulation layer away from the substrate; and
each of the plurality of wires is at least partially on the side of the insulation layer away from the substrate.

8. The light-emitting assembly of claim 7, wherein each of the plurality of wires extends on a surface of the insulation layer away from the substrate.

9. The light-emitting assembly of claim 7, wherein a part of each of the plurality of wires extends on a surface of the insulation layer away from the substrate, and the other part of each of the plurality of wires extends on a surface of the substrate having the light emitting diode to electrically connect to the driving circuit.

10. The light-emitting assembly of claim 1, wherein the plurality of light-emitting diodes are configured to emit the source light of a same color.

11. The light-emitting assembly of claim 1, wherein the plurality of light-emitting diodes are configured to emit the source light of different color; and
the source light is configured to display an image.

12. The light-emitting assembly of claim 1, wherein the plurality of wires are made of metal.

13. A display device comprising a light-emitting assembly and a display assembly; wherein the light-emitting assembly comprises:
a substrate comprising a driving circuit configured for outputting a first driving signal;
a plurality of light-emitting diodes on the substrate and connected to the driving circuit, each of the plurality of light-emitting diodes comprising a first electrode, a second electrode, and a light-emitting layer between the first electrode and the second electrode, the first electrode being connected to the driving circuit to receive the first driving signal;
a plurality of transparent electrodes electrically insulated from each other and connected to a side of the second electrode away from the light-emitting layer, an orthographic projection area of each of the plurality of transparent electrodes on the substrate being larger than an orthographic projection area of each of the plurality of second electrodes on the substrate; and
a plurality of wires connected to the plurality of transparent electrodes, each of the plurality of wires being configured to transmit a second driving signal, wherein each of the plurality of light-emitting diodes being configured to emit source light according to the first driving signal and the second driving signal;
wherein the display assembly is configured to modulate the source light to display images.

14. The display device of claim 13, wherein the plurality of light-emitting diodes are configured to emit the source light of a same color.

15. The display device of claim 13, wherein the orthographic projection of each of the plurality of transparent electrodes on the substrate completely covers the orthographic projection of each of the plurality of second electrodes on the substrate.

16. The display device of claim 13, further comprises a plurality of connection pad connecting between the second electrode and the transparent electrode; and the orthographic projection area of each of the plurality of transparent electrodes on the substrate is larger than an orthographic projection area of each of the plurality of connection pads on the substrate.

17. The display device of claim 16, wherein the orthographic projection of each of the plurality of transparent electrodes on the substrate completely covers the orthographic projection of each of the plurality of connection pads on the substrate.

18. The display device of claim 13, wherein the plurality of wires connected to the driving circuit, and the driving circuit is configured to output the second driving signal.

* * * * *